United States Patent
Regev et al.

(12) 
(10) Patent No.: US 6,775,165 B2
(45) Date of Patent: Aug. 10, 2004

(54) CURRENT SWITCHING SENSOR DETECTOR

(75) Inventors: Zvi Regev, West Hills, CA (US); Alon Regev, Woodland Hills, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/135,563

(22) Filed: May 1, 2002

(65) Prior Publication Data

US 2002/0163825 A1 Nov. 7, 2002

Related U.S. Application Data

(60) Provisional application No. 60/288,038, filed on May 1, 2001.

(51) Int. Cl.[7] .............................................. G11C 15/00
(52) U.S. Cl. ........................ 365/49; 365/204; 327/51; 327/52; 327/53; 327/54; 327/55; 327/56; 327/57; 327/63
(58) Field of Search ............... 365/49, 204; 327/51–57, 327/63

(56) References Cited

U.S. PATENT DOCUMENTS 5,260,643 A * 11/1993 Sandhu ........................ 323/225

\* cited by examiner

*Primary Examiner*—Van Thu Nguyen
(74) *Attorney, Agent, or Firm*—Dickstein Shapiro Morin & Oshinsky LLP

(57) ABSTRACT

A sensor for a switching circuit detects the logical state of the switching circuit by monitoring the current flow through the switching circuit. The current flow is conditioned by one or more current limiters and a voltage regulator, coupled in series with the switching circuit. The sensor also includes a current limit control circuit coupled to each of the current limiters. The sensor is effectively shielded from the effect of parasitic capacitance in the switching device because the current flow through the switching circuit reacts immediately and without regard to the level of parasitic capacitance whenever the switching circuit makes a state change.

15 Claims, 6 Drawing Sheets

US 6,775,165 B2

CURRENT SWITCHING SENSOR DETECTOR

This application claims domestic priority to Provisional Application No. 60/288,038, filed on May 1, 2001, which is incorporated herein by reference.

FIELD OF INVENTION

The present invention relates to sensing a logic state using a sensor or detector. More specifically, the present invention relates to a current sensing architecture for detecting a logic state.

BACKGROUND OF THE INVENTION

One way to detect the logic state of a switching device is to couple the device between a power source and ground and measuring the resulting voltage. For example, in FIG. 1A, power is applied at terminal 101, which is coupled in series with a resistor 102 and a switching device 104 to a ground 105. The switching device 104 may be a single switching device, such as a transistor, or a more complex device, such as a series of switching devices which form a logic circuit having a logic output. The logic state of the switching device 104 may be determined by measuring the voltage at terminal 103. If the voltage at terminal 103 is relatively high, then the switching device 104 is in a open state. Similarly, if the voltage at terminal 103 is relatively low, then the switching device 104 is in a closed state. The change in voltage at terminal 103 is related to the current flow rate through the switching device. Thus, the voltage sensing at terminal 103 should be performed only after the sufficient time has elapsed for the voltage to become stable after a state change in the switching device 104.

An issue which arises when using a circuit such as illustrated in FIG. 1A in a semiconductor device is that of parasitic capacitance. Parasitic capacitance is a unwanted capacitance resulting from the fabrication of the semiconductor device and is typically associated with conductive lines. FIG. 1B illustrates a circuit equivalent to that illustrated in FIG. 1A, but with the parasitic capacitance illustrated explicitly illustrated as capacitor 106 coupled in parallel to the switching device 104 in-between resistor 102 and ground 105. The effect of parasitic capacitance is to reduce the rate a voltage at node 103 changes over time as the switching device 104 switches states. For example, if the switching device 104 were open and then switched to a close position, the voltage a node 103 in FIG. 1B would fall towards its new value at a slower rate than if the parasitic capacitance 106 were not present. Parasitic capacitance, therefore, increases the time required to detect a changed state of the switching device 104.

One method for compensating the reduced switching speed imposed by parasitic capacitance is to provide increased current flow through the circuit. Increasing the maximum current flow through the switching device 104 discharges the charge stored by the parasitic capacitance faster when switch 104 is closed and changes capacitor 106 faster when switch 104 is opened. Thus, increasing the maximum current flow throughout the circuit permits the voltage at node 103 to reach a stable state faster after the switching device 104 has changed its logical state. Unfortunately, increasing the maximum current flow also increases the power consumption of the circuit. Accordingly, there is a need and desire for a method and apparatus to quickly and efficiently detect a logic state of a device in an environment having significant parasitic capacitance.

SUMMARY OF THE INVENTION

The present invention is directed to an apparatus and method for quickly and efficiently detecting a logic state of a switching device. The present invention incorporates a series circuit coupling a power supply source to ground through a current sensing amplifier, at least one current limiter, a voltage regulator, and the switching device. A current limiter control circuit is coupled to the at least one current limiter. In an alternate embodiment, two current limiters are used in the series circuit. The current sensing amplifier measures the current flowing through the switching device and does not need to wait for charge stored by the parasitic capacitance to charge or discharge before sensing a logic level change. Thus, the present invention is not slowed by parasitic capacitance and does not require increased current flow to compensate for the parasitic capacitance.

BRIEF DESCRIPTION OF THE DRAWINGS

The foregoing and other advantages and features of the invention will become more apparent from the detailed description of exemplary embodiments of the invention given below with reference to the accompanying drawings in which.

DETAILED DESCRIPTION OF THE INVENTION

Figure 1A:
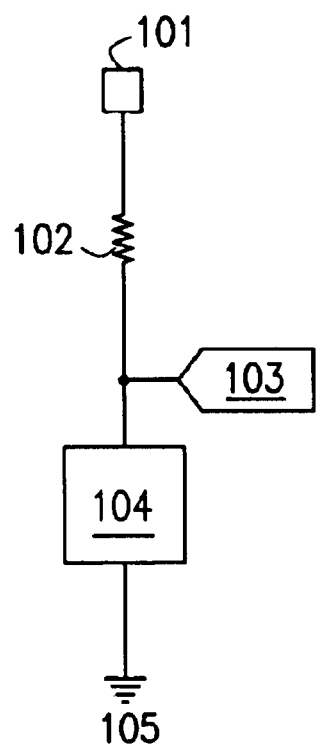
FIG. 1A is a circuit diagram of a conventional voltage detecting circuit for a switching device.
Figure 1B:
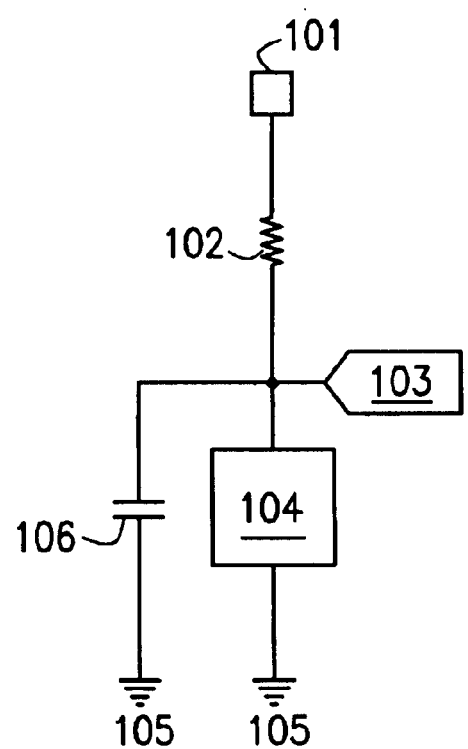
FIG. 1B is a circuit diagram of a conventional voltage detecting circuit switching device in an environment having parasitic capacitance.
Figure 2:
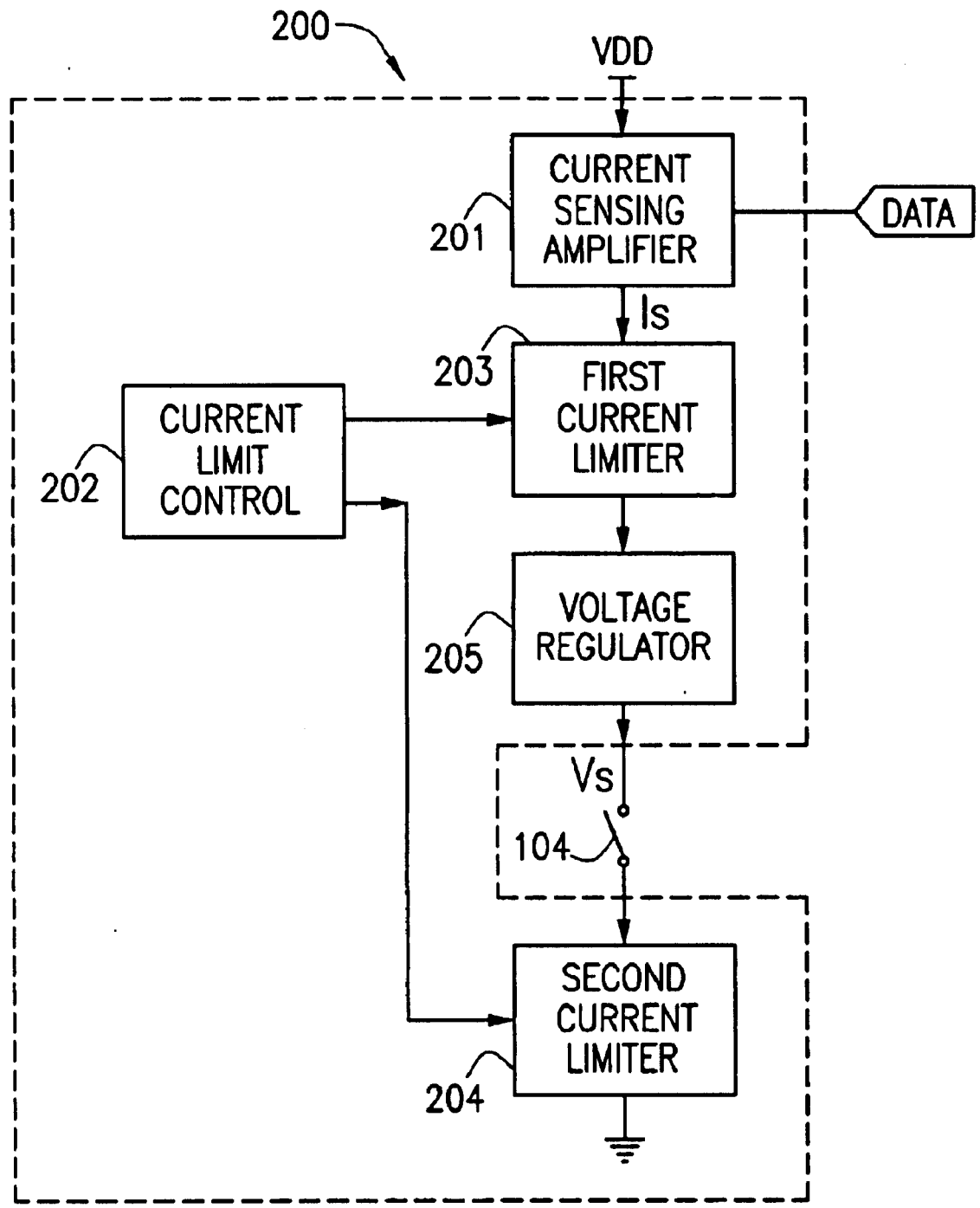
FIG. 2 is a block diagram of one embodiment of the present invention.

Now referring to the drawings, where like reference numerals designate like elements, there is shown in FIG. 2 a block diagram of the present invention 200 coupled to a switching device 104. The present invention includes several components coupled in series between a power source (Vdd) and the switching device 104, and between the switching device 104 and a ground potential. More specifically, a current sensing amplifier 201, a first current limiter 203, and a voltage regulator 205 are coupled in series between the power source and the switching device 104. Additionally, a second current limiter 204 is coupled between the switching device 104 and the ground potential. In an alternate embodiment, the second current limiter 204 is not used. The present invention also includes a current limit control 202, which is coupled to the first and second current limiters 203, 204. The switching device 104 is shown as a switch, e.g., a transistor switch, however, the switching device 104 may be other devices or circuits which act as a logic level switch.

The present invention 200 operates by detecting changes in the current (Is) at current sensing amplifier 201 flowing into a first current limiter 203, the output of which is applied to the voltage regulator 205 which supplies a voltage regulated current to the switch device 104. The switch device 104 is also optionally connected to the second current limiter 204 to ground. As will be explained in greater detail below, the first and second current limiters 203, 205 cooperate with the current limit control circuit 202 to maintain the voltage (Vs) at the upper node of the switching device 104 at a predetermined value.

In a steady state with the switching device 104 in an open state, no current flows through the switching device 104 or the voltage regulator 205. As the switching device 104 transitions to a closed state, discharge current begins to flow through the switching device 104. A portion of this discharge current is caused by the charge stored in the parasitic capacitance (FIG. 2, element 106). At the same time, the voltage regulator 205 attempts to maintain the voltage Vs by supplying a charging current. If the discharge current through the switching device 104 is not limited, the magnitude of the discharge current would be equal to the voltage Vs maintained by the voltage regulator 205 divided by the impedance of the switching device 104 in its closed state.

The FIG. 2 embodiment of the invention includes two current limiters 203, 204 controlled by the current limit control 205 circuit to limit current flow and thereby control power usage. In particular, the first current limiter 203 is used to limit the charging current supplied by the voltage regulator 205, while the second current limiter 204 is used to limit the discharge current through the switching device 204. In the preferred embodiment, the two current limiters 203, 204 are controlled by the current limit control 202 circuit to allow equal amounts of charge and discharge currents to flow, thereby permitting the voltage Vs to be set at a predetermined level. The predetermined level is ideally a low level, in order to minimize the amount of charge stored by the parasitic capacitance.

Figure 3:
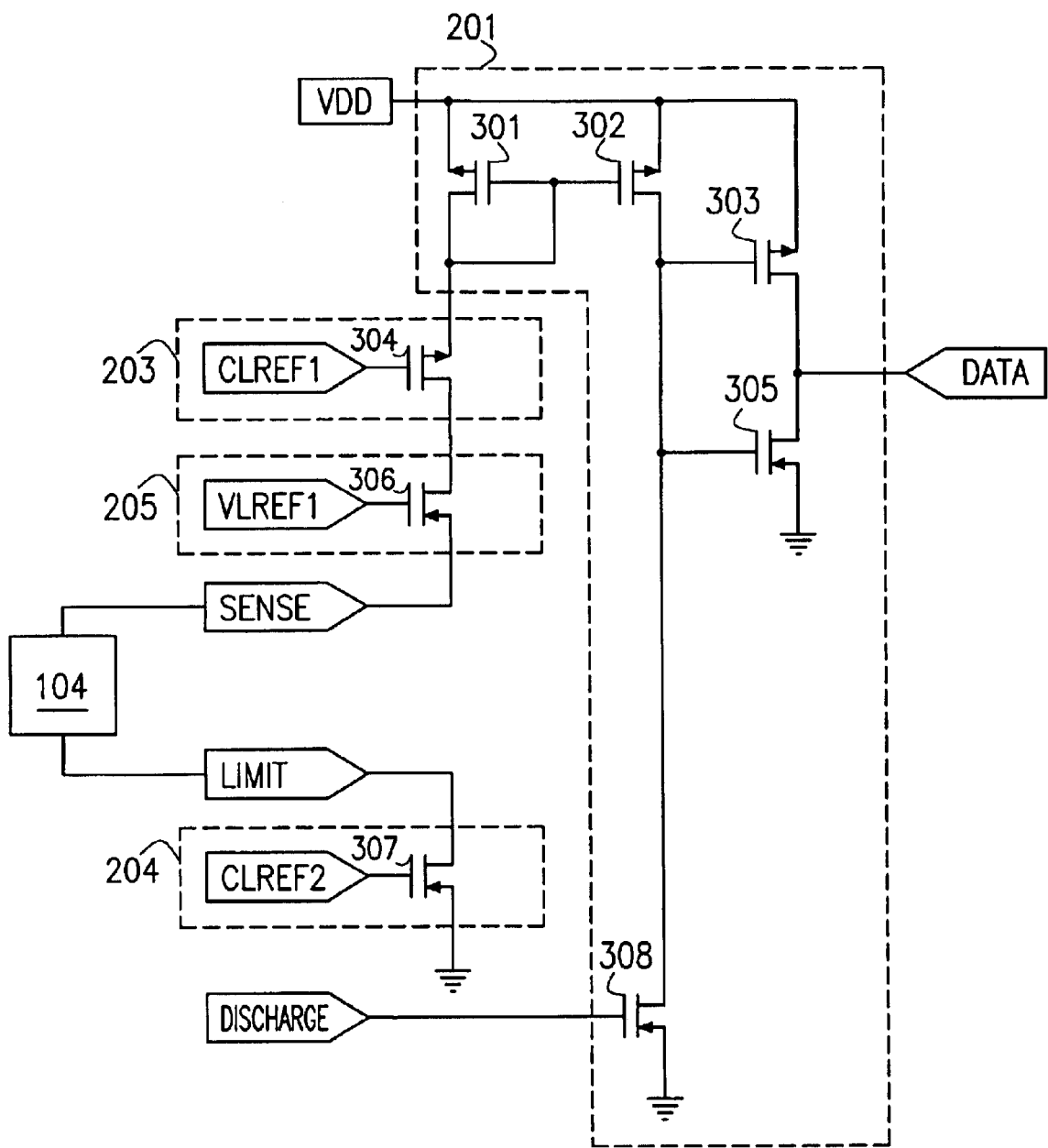
FIG. 3 is a illustration of the current sensing circuit.
Figure 4:
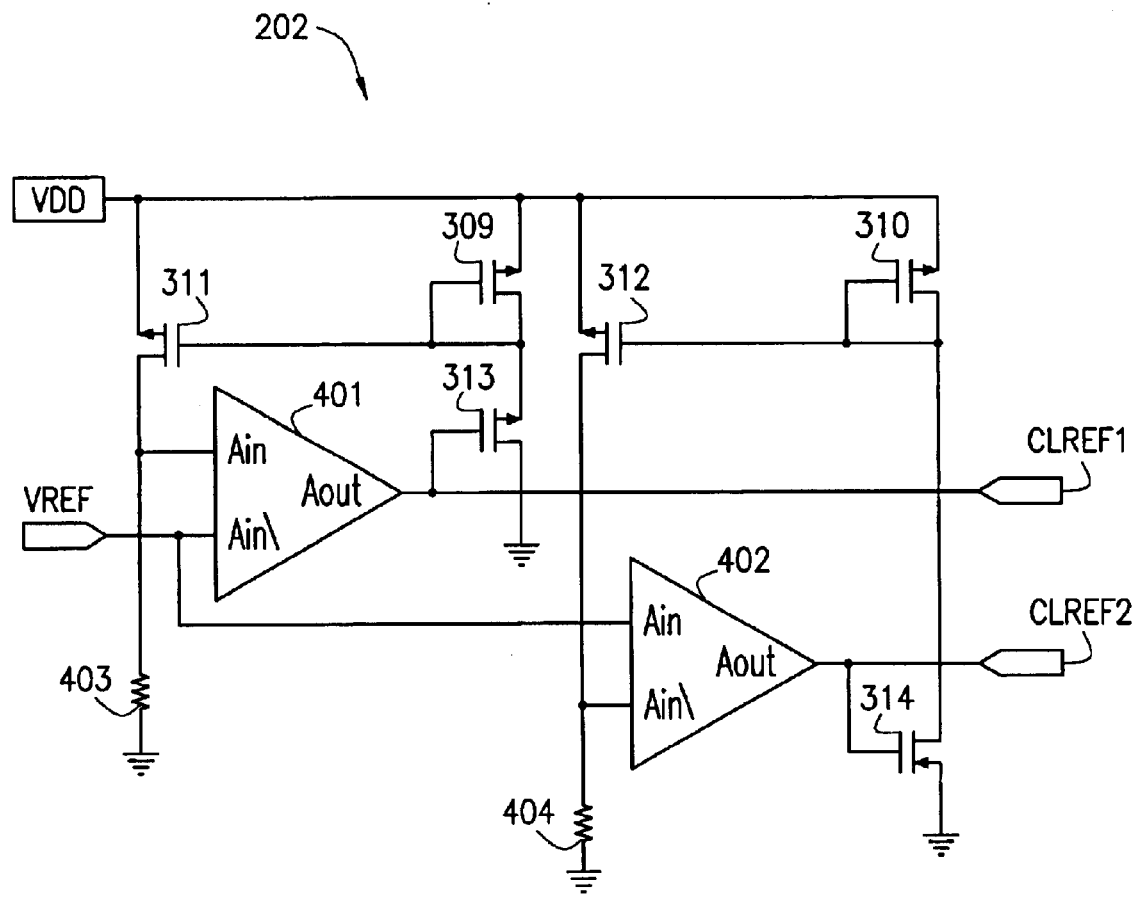
FIG. 4 is a illustration of a current limiter control circuit.

FIGS. 3 and 4 are circuit diagrams illustrating the FIG. 2 exemplary embodiment of the present invention. More specifically, FIG. 3 shows an implementation of the current sensing amplifier 201, the first and second current limiters 203, 204, and the voltage regulator 205, while FIG. 4 illustrates the current limit control circuit 202.

As shown in FIG. 3, the current sensing amplifier 201 can be constructed as a circuit having five transistors. More specifically, transistors 301, 302 form a current mirror whereby current flows through transistors 302 mirrors the current flow through transistor 301, while transistors 303, 305 form an invertor/comparator which converts the voltage on the drain of transistor 308 to the logic signal DATA. The transistor 308, which also has its source coupled to a ground potential and its gate coupled to a DISCHARGE pin, is used to discharge any charge stored within the current sensing amplifier 201 due to its own parasitic capacitance.

The first and second current limiters 203, 204 are implemented as a single transistor acting as a variable resistor. The first current limiter includes transistor 304 which has its gate voltage controlled by the signal CLREF1, while the second current limiter 204 includes transistor 307, which has its gate voltage controlled by the signal CLREF2. The CLREF1 and CLREF2 signals are governed by the current limit control 202 circuit, explained below with reference to FIG. 4.

The voltage regulator 205 is also implemented using a single transistor 306. The transistor 306 has its drain coupled to the drain of transistor 304. The transistor 306 has its gate voltage coupled to a DC voltage reference signal VREF. The output impedance of the transistor 306, at the SENSE pin, is low.

Now referring to FIG. 4, the current limit control circuit 202 may be formed from opamps 401, 402, resistors 403, 404, and transistors 309–314. A fixed, temperature stable reference voltage is supplied at the VREF pin. This reference voltage is applied to both opamps 401, 402. When the circuit 202 is settled, the voltage levels on the inverting (Ain\) pin of each opamp 401, 402 must be equal to the non-inverting (Ain) pin. Under these conditions the voltage across resistor 403 equals the voltage across resistor 404. In the preferred embodiment the resistance of both resistors 403, 404 are equal, causing the current which flows through both resistors 403,404 to be equal as well. The current which flows through resistor 403 is generated by a current mirror formed by transistors 309, 311. The current through transistor 311 and 309 are equal and controlled by transistor 313 and opamp 401. The current through transistor 313 equals the current through resistor 403. The voltage which controls transistor 313 is coupled to CLREF1.

Similarly, the current which flows through resistor 404 is generated by a current mirror formed by transistors 312,310. The current through transistor 311 and 309 are equal and controlled by transistor 314 and opamp 402. The current through transistor 314 equals the current through resistor 404. The voltage which controls transistor 314 is coupled to CLREF2. In the preferred embodiment the CLREF1 and CLREF2 signals are set so that the current limit in the first and second current limiters 203, 204, i.e., the current through transistors 304, 307 are equal, and there is net no current which would charge or discharge the parasitic capacitance. A possible modification to the current limiter control circuit 202, for use in connection with an alternate embodiment utilizing a single current limiter, is described below in connection with FIG. 5.

Referring again to FIG. 3, the switching device 104 is coupled between the SENSE and LIMIT pins. The parasitic capacitance can be thought of as a capacitor coupled between the SENSE pin and ground. When the switching device is in a closed state, current will flow from the SENSE pin through the switching device 104 to the LIMIT pin.

The switching device 104 is coupled between the SENSE pin and the LIMIT pin (in the embodiment using both current limiters 203, 204) or between the SENSE pin and ground (in the embodiment using only current limiter 203). Under either embodiment, the parasitic capacitance of the switching device 104 can be thought of as a capacitor coupled between the SENSE pin and the ground. When the switching device 104 is in a closed state, current will flow from the SENSE pin through the switching device 104 to the limit pin. If the current limiters 203, 204 are set to the same current limit, the parasitic capacitance of the switching device 104 will not be charging or discharging. Thus, the voltage at the sense pin will remain constant.

At the current sensing amplifier 201, the DISCHARGE pin is normally kept at a low logic level. The transistor 308 is therefore behaves like an open circuit, and permits the small current generated by transistor 302 to rapidly charge the parasitic capacitance associated with the current sensing amplifier 201 (i.e, transistors 301, 302, 303, 305, 308).

When the switching device 104 moves from a closed state to an open state, no current can flow through the voltage regulator 305 (i.e., transistor 306). Additionally, since the parasitic capacitance associated with both the switching device 104 and the current sensing amplifier 201 are charged, no current flows due to the parasitic capacitance. Thus, the output produced by the current sensing amplifier 201 at the DATA pin is stable and corresponds to the switching device 104 being in a open state.

After one (and before the next) current sensing operation, the parasitic capacitance of the current sensing amplifier 201 must be discharged. This may be done by temporarily placing a high level signal on the DISCHARGE pin, which causes transistor 308 to behave like an closed circuit, permitting the charge stored in the parasitic capacitance to flow to ground through transistor 308. Since the parasitic capacitance of the current sensing amplifier 201 is low relative to the parasitic capacitance of the switching device 104, the parasitic capacitance of the current sensing amplifier 201 may be charged or discharged quickly. The state of the DISCHARGE pin is normally toggled high for a brief period of time as the switching device 104 changes state. The output at the DATA pin of the current sensing amplifier 201 is stable a short time after the state of the DISCHARGE pin returns low after being toggled high as the switching device 104 changes states.

When the switching device 104 moves to a closed state from an open state, a current begins to immediately flow through the switching device 104. A portion of this current flow is from the voltage regulator 205, as the voltage regulator attempts to maintain the voltage at the SENSE pin at a predetermined value. Another portion of the current flow is a discharge current from the parasitic capacitance. The portion of the current which flows through the voltage regulator 205 also flows through the first current limiter 203 and the current sensing amplifier 201. The current flow through transistor 301 is mirrored in transistor 302 and is quickly output as a signal on the DATA pin by inverter 303, 305.

Figure 5:
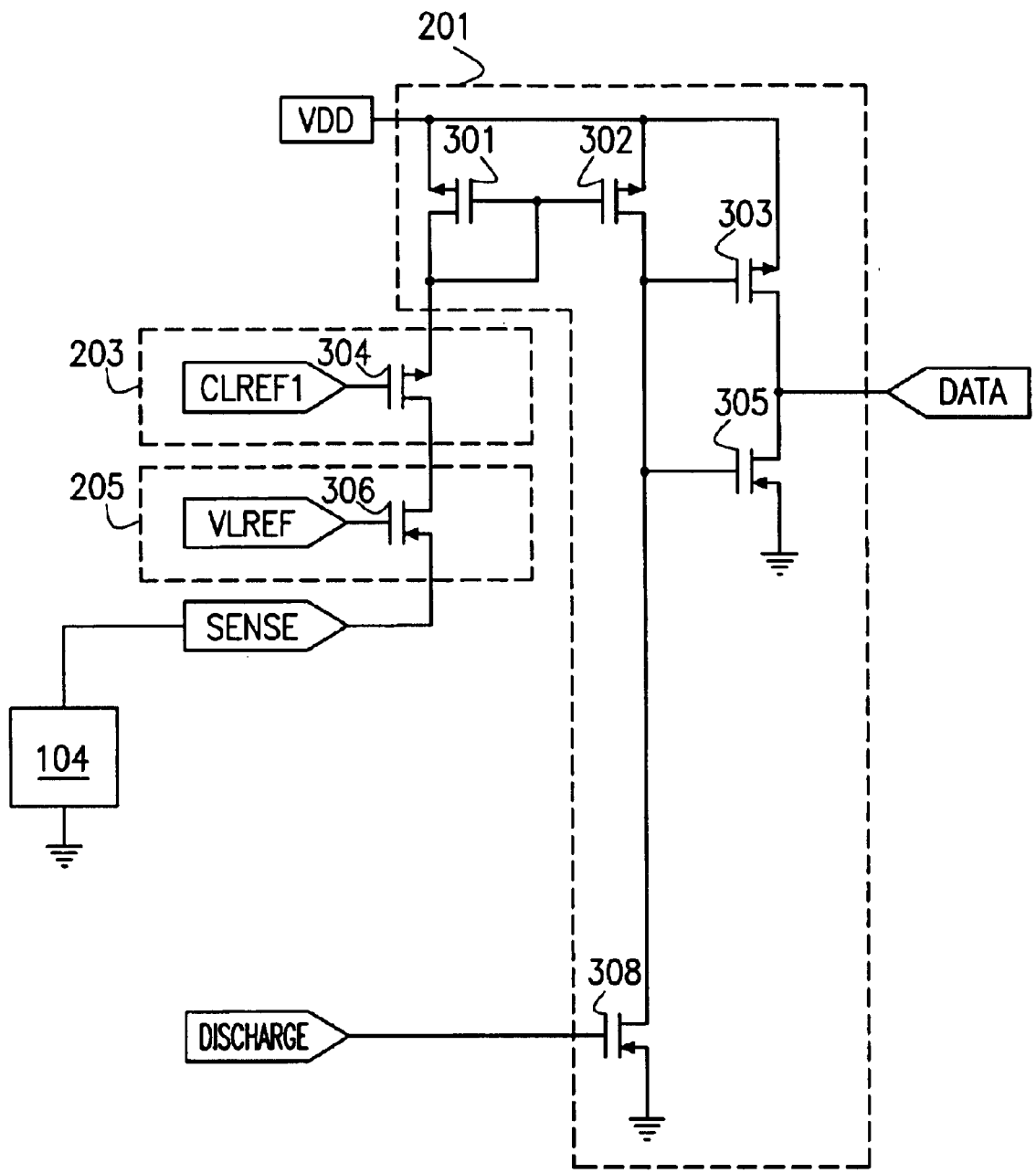
FIG. 5 is an illustration of an alternate embodiment of the current sensing circuit.

FIG. 5 illustrates an alternate embodiment which does not utilize the second current limiter 204. This alternate embodiment features the same circuitry for the current sensing amplifier 201, the first current limiter 203, and the voltage regulator 205. However, since the second current limiter 204 has been removed, the switching device 104 is coupled between the SENSE pin and a source of ground potential. In this embodiment, the CLREF2 signal is not used since there is only a single current limiter 203, which is controlled by the CLREF1 signal. Although the current limiter control circuit 202 illustrated in FIG. 4 may also be used in this embodiment, since it generates control signals CLREF1, CLREF2, in the interest of efficiency the circuit of FIG. 4 may be modified by eliminating opamp 402, resistor 404, transistors 310, 312, and 314, and node CLREF2. The resulting circuit would then only generate the CLREF1 control signal, which is all that is needed in the single current limiter embodiment.

Figure 6:
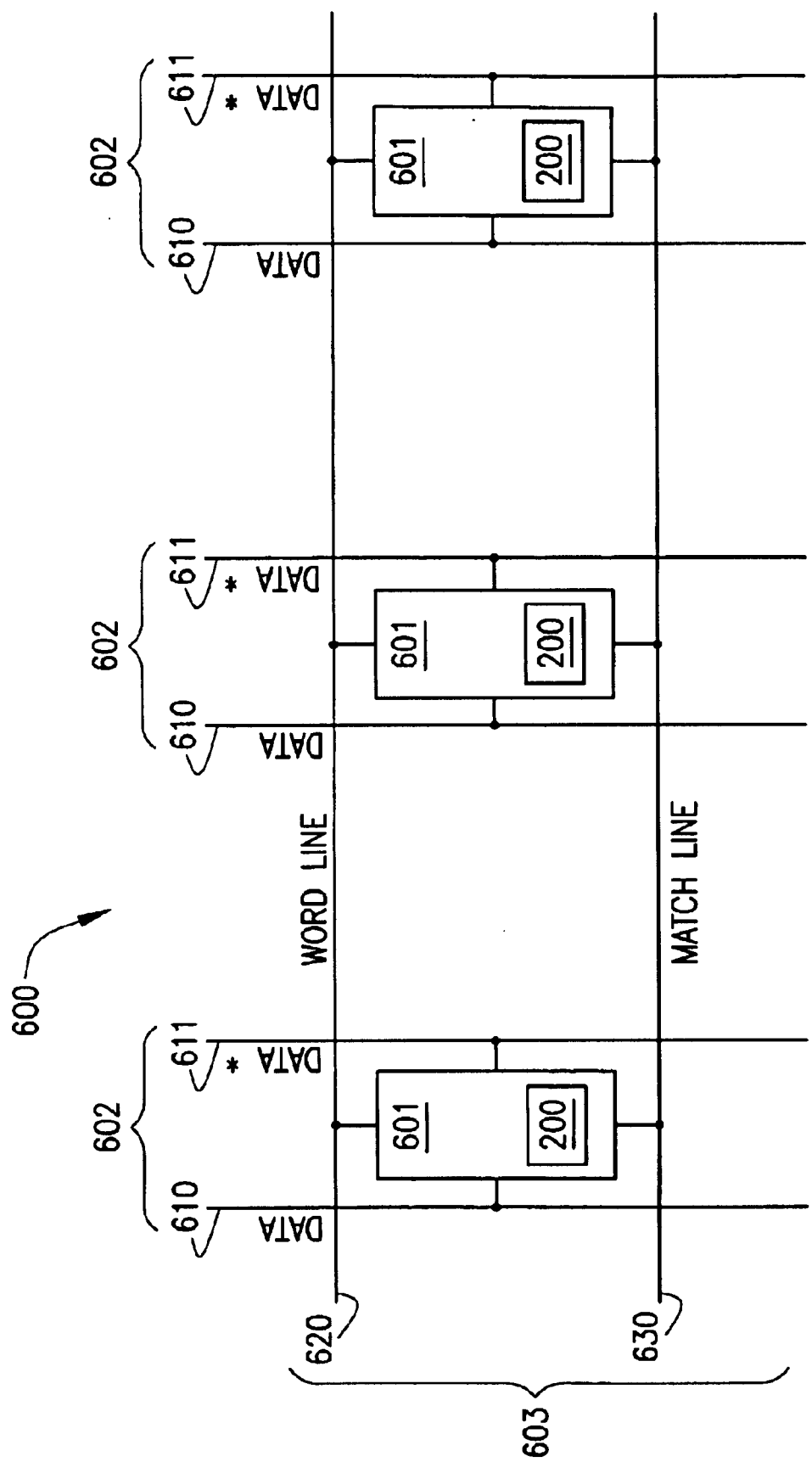
FIG. 6 is a block diagram of a CAM memory array having CAM cells which incorporate the match detection circuitry of the present invention.

The present invention may be used in any application where parasitic capacitance may be a concern. For example, one such application may be in content addressable memory systems. Referring now to FIG. 6, a portion of a CAM memory array 600 using the present invention is illustrated. The CAM array 600 includes a plurality of CAM cells 601 which are arranged in rows 602 and columns 603. Each CAM cell 601 includes a match detection circuit 200 which may employ the logic state detector of the present invention. CAM cells 601 are coupled to each column 602 via complementary DATA 610 and DATA* 611 lines. Similarly, the CAM cells 601 are coupled to each row via a word line 620 and a match line 630.

In a CAM, each stored data word may be searched against a target data pattern. For example, the search data may be placed upon the DATA 610 and DATA* 611 lines. A search is conducted simultaneously on all data words in the CAM. The match detection circuit 200 of the present invention may be used to detect the match between data on the data lines, and stored data. If the stored and search data do not match, the match line (which is pre-charged before the search data is asserted on the DATA 610 and DATA* 611 lines) is discharged through the cell 601. Thus, the match line 620 remains high only when the entire word matches the search data.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A method for detecting a logical state of a switching circuit, comprising the steps of:
   detecting a current flow caused by operation of said switching circuit arranged in a series circuit between a power terminal and a ground terminal, said step of detecting comprising:
      maintaining a voltage level at one node of said switching circuit;
      limiting the current flow to less than a first predetermined value; and
   sensing the current flow; and
   outputting a signal indicating said logical state based on said current flow.

2. The method of claim 1, wherein said step of limiting further comprising,
   a first limiting for limiting the current flow between the power terminal and the switching circuit to a second predetermined value, and
   a second limiting for limiting the current flow between the switching circuit and the ground terminal to a third predetermined value.

3. The method of claim 1, wherein the step of detecting further comprises outputting a signal corresponding to the current flow.

4. The method of claim 1, wherein the step of limiting is controlled by a current limit control circuit.

5. The method of claim 2, wherein the first limiting and the second limiting are controlled by a current limit control circuit.

6. The method of claim 5, wherein said second and third predetermined values are approximately equal.

7. A circuit for detecting a logical state of a switching circuit, comprising:
   a current sensing amplifier for detecting a current flow state between a first and second terminals, said current sensing amplifier also indicating said current flow state on a data terminal;
   a first current limiter having a third and fourth terminals and a first control terminal for accepting a first control signal to controllably limiting current flow between said third and fourth terminals, said first current limiter being coupled in series with the current sensing amplifier between said second and third terminals;
   a voltage regulator having a fifth and sixth terminals, said voltage regulator being coupled in series with said first current limiter between said fourth and fifth terminals and said sixth terminal being adapted to be coupled to the switching circuit;
   a current limit control circuit coupled to said first control terminal and for supplying said first control signal.

8. The circuit of claim 7, further comprising:

a second current limiter having a seventh terminal adapted to be coupled to the switching circuit and a eighth terminal coupled to a ground potential and a second control terminal for accepting a second control signal for controllably limiting current flow between said seventh and eighth terminals; and wherein said current limit control circuit is also coupled to said second control terminal and also supplies said second control signal.

9. The circuit of claim 7, wherein said current sensing amplifier further comprises:

a first and second transistors, arranged to form a current mirror between said first terminal and said second terminal and between said first terminal and a third transistor;

a fourth transistor having a drain coupled to said first terminal and a source coupled to said data terminal; and a fifth transistor having a source coupled to a ground potential and drain coupled to said data terminal;

wherein a source of said third transistor is coupled to a ground potential and wherein a drain of said third transistor is coupled to a source of said second transistor, a gate of said fourth transistor, and a gate of said fifth transistor.

10. The circuit of claim 9, wherein said first current limiter comprises, a transistor;

wherein said transistor has a gate coupled to said first control terminal, a source coupled to said fourth terminal; and a drain coupled to said third terminal.

11. The circuit of claim 7, wherein said voltage regulator comprises, a transistor;

wherein a gate of said terminal is coupled to a first reference terminal, a source of said transistor is coupled to said sixth terminal, and a drain coupled to said fifth terminal.

12. The circuit of claim 7, wherein said second current limiter comprises, a transistor;

wherein said transistor has a gate coupled to said second control terminal, a source coupled to eighth terminal, and a drain coupled to said seventh terminal.

13. The circuit of claim 7, wherein said current limit control circuit further comprises:

a first power terminal;

a second power terminal;

a first and second transistors, arranged to form a first current mirror between said first power terminal and a first resistor, and between said first power terminal and a third transistor;

a first op-amp, having a complementary input coupled to said second power terminal and an input coupled to said first current mirror between said first transistor and said first resistor, and an output coupled to said first control terminal and a gate of said third transistor;

a fourth and fifth transistors, arranged to form a second current mirror between said first power terminal and a second resistor and between said fifth transistor and a sixth transistor;

a second op-amp, having a input coupled to said second power terminal, a complementary input coupled to said second current mirror between said fourth transistor and said second resistor, and an output coupled to said second control terminal and a gate of said sixth transistor.

14. A circuit for detecting a logical state of a switching circuit, comprising:

a current sensing amplifier for detecting a current flow state and indicating the current flow state at a data pin, said current sensing amplifier further comprising, a first node coupled to a power source;

a first, second, third, fourth, and fifth transistors, wherein said first transistor has a source coupled to the first node and a drain coupled to a second node;

said second transistor has a source coupled to the first node and a drain coupled to a third node;

said first and second transistors forming a current mirror between said first and second nodes and between said first and third nodes;

said third transistor having a source coupled to said first node, a drain coupled to said data pin, and a gate coupled to said third node;

said fourth transistor having a source coupled to ground, a drain coupled to said data pin, and a gate coupled to the third node; and said fifth transistor having a source coupled to ground, a drain coupled to said third node, and a gate coupled to a discharge terminal;

a first current limiter comprising a sixth transistor having a source coupled to said second node, a drain coupled to a fourth node, and a gate coupled to a first control terminal;

a voltage regulator comprising a seventh transistor having a source coupled to a sense pin, a drain coupled to the fourth node, and a gate coupled to a reference voltage, wherein the sense pin is adapted to be coupled to the switching circuit.

15. The circuit of claim 14, further comprising:

a second current limiter comprising a eighth transistor having a source coupled to ground, a drain coupled to a limit pin, and a gate coupled to a second control terminal;

wherein said limit pin is adapted to be coupled to the switching circuit.

* * * * *

UNITED STATES PATENT AND TRADEMARK OFFICE
CERTIFICATE OF CORRECTION

PATENT NO. : 6,775,165 B2
APPLICATION NO. : 10/135563
DATED : August 10, 2004
INVENTOR(S) : Zvi Regev et al.

It is certified that error appears in the above-identified patent and that said Letters Patent is hereby corrected as shown below:

Column 1, line 26, "a open" should read --an open--;

Column 1, line 37, "a unwanted" should read --an unwanted--;

Column 1, lines 41-42, "illustrated explicitly illustrated" should read --explicitly illustrated--;

Column 1, line 48, "a node" should read --at node--;

Column 2, line 33, "a illustration" should read --an illustration--;

Column 2, line 34, "a illustration" should read --an illustration--;

Column 4, line 26, "is net no" should read --is no--;

Column 4, line 53, "is therefore behaves" should read --therefore behaves--; and Column 5, line 3, "an closed" should read --a closed--.

Claim 10, column 7, line 27, "claim 9" should read --claim 7--.

Claim 12, column 7, line 45, "to eighth" should read --to an eighth--;

Claim 13, column 8, line 8, "a input" should read --an input--; and

Claim 15, column 8, line 50, "a eighth" should read --an eighth--.

Signed and Sealed this

Sixth Day of March, 2007

JON W. DUDAS
*Director of the United States Patent and Trademark Office*